United States Patent
Bayerer

(10) Patent No.: US 10,177,057 B2
(45) Date of Patent: Jan. 8, 2019

(54) POWER SEMICONDUCTOR MODULES WITH PROTECTIVE COATING

(71) Applicant: Infineon Technologies AG, Neubiberg (DE)

(72) Inventor: Reinhold Bayerer, Reichelsheim (DE)

(73) Assignee: Infineon Technologies AG, Neubiberg (DE)

( * ) Notice: Subject to any disclaimer, the term of this patent is extended or adjusted under 35 U.S.C. 154(b) by 12 days.

(21) Appl. No.: 15/380,656

(22) Filed: Dec. 15, 2016

(65) Prior Publication Data
US 2018/0174936 A1    Jun. 21, 2018

(51) Int. Cl.
| | |
|---|---|
| *H01L 23/29* | (2006.01) |
| *H01L 23/31* | (2006.01) |
| *H01L 23/18* | (2006.01) |
| *H01L 23/28* | (2006.01) |
| *C09K 21/06* | (2006.01) |

(52) U.S. Cl.
CPC ............ *H01L 23/293* (2013.01); *C09K 21/06* (2013.01); *H01L 23/18* (2013.01); *H01L 23/28* (2013.01); *H01L 23/3107* (2013.01); *H01L 23/3135* (2013.01); *H01L 23/3142* (2013.01); *H01L 23/3157* (2013.01); *H01L 23/3192* (2013.01); *H01L 2223/58* (2013.01)

(58) Field of Classification Search
CPC ..... H01L 23/18; H01L 23/28; H01L 23/3142; H01L 23/3192
USPC .................................................. 257/666.676
See application file for complete search history.

(56) References Cited

U.S. PATENT DOCUMENTS

| | | | |
|---|---|---|---|
| 4,323,914 A | 4/1982 | Berndlmaier et al. | |
| 5,164,816 A | 11/1992 | Nishizawa et al. | |
| 5,268,202 A | 12/1993 | You et al. | |
| (Continued) | | | |

FOREIGN PATENT DOCUMENTS

| | | |
|---|---|---|
| WO | 2015000591 A2 | 1/2015 |
| WO | 2015029386 A1 | 3/2015 |

OTHER PUBLICATIONS

"Parylene Conformal Coating Specifications & Properties", Specialty Coating Systems, Inc. 2012. Also available online at http://www.scscookson.com/parylene/properties.cfm.
(Continued)

*Primary Examiner* — David Vu
*Assistant Examiner* — Brandon Fox
(74) *Attorney, Agent, or Firm* — Murphy, Bilak & Homiller, PLLC

(57) ABSTRACT

A semiconductor package is described which meets a plurality of predetermined electrical, mechanical, chemical and/or environmental requirements. The semiconductor package includes a semiconductor die embedded in or covered by a molded plastic body, the molded plastic body satisfying only a subset of the plurality of predetermined electrical, mechanical, chemical and/or environmental requirements. The semiconductor package further includes a plurality of terminals protruding from the molded plastic body and electrically connected to the semiconductor die, and a coating applied to at least part of the molded plastic body and/or part of the plurality of terminals. The coating satisfies each predetermined electrical, mechanical, chemical and/or environmental requirement not satisfied by the molded plastic body.

22 Claims, 4 Drawing Sheets

(56) References Cited

U.S. PATENT DOCUMENTS

| | | | |
|---|---|---|---|
| 5,274,913 A | 1/1994 | Grebe et al. | |
| 5,405,808 A | 4/1995 | Rostoker et al. | |
| 5,622,898 A | 4/1997 | Zechman | |
| 5,824,568 A | 10/1998 | Zechman | |
| 5,825,042 A * | 10/1998 | Strobel | G21F 1/08 |
| | | | 250/515.1 |
| 6,140,144 A | 10/2000 | Najafi et al. | |
| 6,368,899 B1 * | 4/2002 | Featherby | H01L 23/293 |
| | | | 257/E23.025 |
| 6,770,822 B2 | 8/2004 | Pastemak et al. | |
| 6,885,522 B1 | 4/2005 | Kira et al. | |
| 6,956,283 B1 | 10/2005 | Peterson | |
| 7,116,557 B1 | 10/2006 | Raby et al. | |
| 7,763,318 B2 * | 7/2010 | Maruyama | C08G 61/02 |
| | | | 427/255.28 |
| 7,767,589 B2 | 8/2010 | Bedinger et al. | |
| 7,906,822 B2 * | 3/2011 | Mizuno | B81B 7/0038 |
| | | | 257/415 |
| 8,581,113 B2 | 11/2013 | Sanjuan et al. | |
| 8,674,462 B2 | 3/2014 | Wombacher et al. | |
| 8,847,412 B2 | 9/2014 | Haba et al. | |
| 9,852,918 B2 * | 12/2017 | Teh | H01L 23/3142 |
| 2002/0060356 A1 | 5/2002 | Nishibori et al. | |
| 2003/0013235 A1 | 1/2003 | Featherby et al. | |
| 2004/0140116 A1 | 7/2004 | Bayerer et al. | |
| 2004/0217465 A1 | 11/2004 | Stolze | |
| 2005/0104189 A1 | 5/2005 | Akagawa et al. | |
| 2005/0116357 A1 | 6/2005 | Fitzsimmons et al. | |
| 2005/0161778 A1 | 7/2005 | Morelle | |
| 2005/0258550 A1 | 11/2005 | Morita et al. | |
| 2006/0108601 A1 | 5/2006 | Okamoto | |
| 2007/0262426 A1 * | 11/2007 | Mahler | C08G 18/72 |
| | | | 257/669 |
| 2007/0284719 A1 | 12/2007 | Shiota et al. | |
| 2008/0230905 A1 | 9/2008 | Guth et al. | |
| 2009/0039498 A1 | 2/2009 | Bayerer | |
| 2009/0102040 A1 | 4/2009 | Specht et al. | |
| 2010/0140778 A1 | 6/2010 | Weekamp et al. | |
| 2010/0164083 A1 | 7/2010 | Yim | |
| 2011/0309375 A1 * | 12/2011 | Kato | H01L 21/565 |
| | | | 257/77 |
| 2012/0112347 A1 | 5/2012 | Eckhardt et al. | |
| 2012/0223432 A1 | 9/2012 | Delucca et al. | |
| 2013/0221509 A1 * | 8/2013 | Oda | H01L 24/97 |
| | | | 257/676 |
| 2015/0001700 A1 | 1/2015 | Hartung et al. | |

OTHER PUBLICATIONS

"SCS Parylene Properties", Specialty Coating Systems, Inc. 2007, pp. 1-12.

"Vapor Deposition of Parylene-F Films", Rensselaer Polytechnic Institute, 2008, p. 1.

* cited by examiner

POWER SEMICONDUCTOR MODULES WITH PROTECTIVE COATING

TECHNICAL FIELD

The present application relates to power semiconductor modules, in particular power semiconductor modules which must satisfy a plurality of predetermined electrical, mechanical, chemical and/or environmental requirements.

BACKGROUND

Power semiconductor modules typically included a molded plastic body such as a plastic molding compound in which power semiconductor dies are embedded, or a plastic housing which covers the power semiconductor dies. Commonly used package materials are epoxies used in transfer molding devices or as potting material in modules, silicone gel used as potting material in modules, and engineering plastics such as PBT (polybutylene terephthalate), PET (polyethylene terephthalate), polyamide, PPS (polyphenylene sulfide), etc. as housing/envelope materials. Such materials not only have to fulfil predetermined mechanical requirements (e.g. elongation at yield ≥1%, preferred; electrical RTI≥140° C., mechanical RTI≥140° C.), but also environmental (e.g. related standards: RoHS; REACH), fire and smoke (e.g. related standards: UL94V0; EN45545, including HL2 and R22) as well as electrical (e.g. related standards: IEC60664, including CTI>400, 600) and chemical (e.g. low content of solvable ions) requirements.

Mechanical requirements are a consequence of joining the plastic material to metals, substrates and/or semiconductors. The plastic material becomes elongated, bent or compressed during temperature cycling as the CTE (coefficient of thermal expansion) of the different materials does not match, and also the temperature is not homogenous if temperature cycles are generated by power losses in the power semiconductors and a temperature gradient exists between the heat sources and the environment and heatsinks. The plastic material should not crack during such stress. Therefore, the elongation at yield is an important figure. High temperature applied to the plastic also should not change the mechanical and electrical characteristics too much, which is covered by RTI (relative thermal index). RTI indicates the ability of a material to retain a particular property (physical, electrical, etc.).

Electrical and chemical requirements are combined for harsh environmental conditions. Under humid atmosphere and applied voltage bias, the plastic materials should not cause corrosion of terminals, substrates or semiconductors. An 85° C./85% RH (relative humidity) test with applied blocking voltage (e.g. 100%, 80% or 60% of blocking voltage) of the semiconductors should for example last for 168 h, 500 h or even 1000 h without causing excessive leakage current between terminals, substrate tracks or semiconductor electrodes. The REACH regulation (Registration, Evaluation, Authorisation and Restriction of Chemicals) promulgated by the EU outlines a directive for restricting the use of hazardous substances in electrical and electronic equipment—the so-called RoHS (restriction of hazardous substances) directive (see http://eur-lex.europa.eu/LexUriServ/LexUriServ.do?uri=OJ:L:2011:174:0088:0110:de:PDF)

To fulfil mechanical, environmental and fire and smoke requirements, additives are typically used. Additives such as flame retardants, fibers, minerals and other chemicals often comprise the electrical characteristics of the package. For example, dielectric strength of the molded plastic body may be weakened over a long lifetime by ions or interfaces introduced by additives. Insulating characteristics may be weakened especially in a humid environment, or in a salt mist or acidic gaseous atmosphere. Also, the package terminals may corrode where contacted by the molded plastic body and corrosive by-products may propagate over the surface of insulating portions. Semiconductor characteristics may be influenced as well by ionic additives. The predetermined electrical requirement CTI (comparative tracking index), which relates to creepage between life parts, typically requires another kind of additive.

As such, there is a need for a power semiconductor module which satisfies a plurality of predetermined electrical, mechanical, chemical and/or environmental requirements but without adversely affecting various characteristics of the package components.

SUMMARY

According to an embodiment of a semiconductor package which meets a plurality of predetermined electrical, mechanical, chemical and/or environmental requirements, the semiconductor package comprises a semiconductor die embedded in or covered by a molded plastic body, the molded plastic body satisfying only a subset of the plurality of predetermined electrical, mechanical, chemical and/or environmental requirements. The semiconductor package further comprises a plurality of terminals protruding from the molded plastic body and electrically connected to the semiconductor die, and a coating applied to at least part of the molded plastic body and/or part of the plurality of terminals. The coating satisfies each predetermined electrical, mechanical, chemical and/or environmental requirement not satisfied by the molded plastic body.

According to an embodiment of a method of manufacturing a semiconductor package which meets a plurality of predetermined electrical, mechanical, chemical and/or environmental requirements, the method comprises: applying a coating to at least part of a molded plastic body and/or part of a plurality of terminals; and embedding or covering a semiconductor die by the molded plastic body. The terminals protrude from the molded plastic body and are electrically connected to the semiconductor die. The molded plastic body satisfies only a subset of the plurality of predetermined electrical, mechanical, chemical and/or environmental requirements. The coating satisfies each predetermined electrical, mechanical, chemical and/or environmental requirement not satisfied by the molded plastic body.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide a power semiconductor package which meets a plurality of predetermined electrical, mechanical, chemical and/or environmental requirements. The semiconductor package includes a molded plastic body that satisfies only a subset of the plurality of predetermined electrical, mechanical, chemical and/or environmental requirements. The semiconductor package further includes a coating applied to at least part of the molded plastic body and/or part of the package terminals, the coating satisfying each predetermined electrical, mechanical, chemical and/or environmental requirement not satisfied by the molded plastic body. With such a package construction, certain requirements are fulfilled just by the coating while other requirements are fulfilled just by the plastic material. By separating the package requirements between the coating and the bulk plastic material, some conventional additives can be omitted while still fulfilling the overall requirements of the package.

Figure 3:
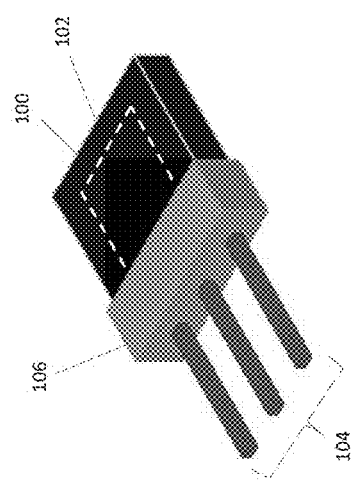
FIGS. 1 through 3 illustrate perspective views of different embodiments of a semiconductor package which meets a plurality of predetermined electrical, mechanical, chemical and/or environmental requirements, and which includes one or more semiconductor dies embedded in a molded plastic body.
Figure 2:
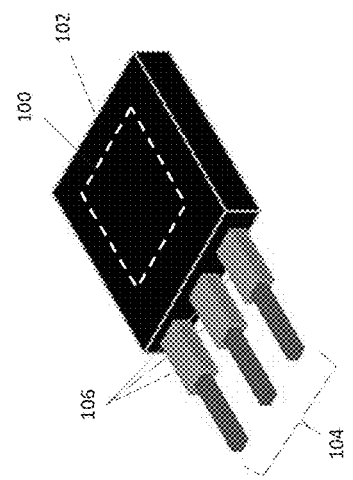
Figure 1:
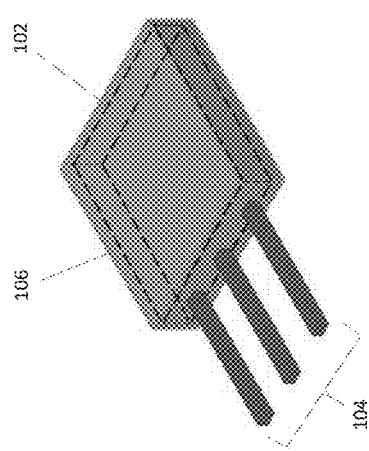

FIGS. 1 through 3 illustrate different embodiments of a semiconductor package which meets a plurality of predetermined electrical, mechanical, chemical and/or environmental requirements, and which includes one or more semiconductor dies 100 embedded in a molded plastic body 102. A plurality of terminals 104 protrude from the molded plastic body 102 and are electrically connected to the semiconductor die 100 e.g. as leads of a leadframe or via bond wires, metal clips, metal ribbons, etc. Electrical connections between the package terminals 104 and each semiconductor die 100 included in the package are not shown for ease of illustration in FIGS. 1 through 3.

One semiconductor die 100 is shown for ease of illustration, however, the package may include more than one semiconductor die. Each semiconductor die 100 housed within the package may include one or more active devices such as transistors and/or diodes, one or more passive devices such as capacitors and/or inductors, or a combination of passive and active devices. The type of device(s) implemented by each semiconductor die 100 is unimportant, and any type of semiconductor die(s) can be included in the package.

The molded plastic body 102 is out of view in FIG. 1, and illustrated with a dashed box. The semiconductor die 100 is out of view in FIGS. 1-3, and illustrated with a dashed square in FIGS. 2-3. In each embodiment, the molded plastic body 102 satisfies only a subset of the plurality of predetermined electrical, mechanical, chemical and/or environmental requirements.

One predetermined electrical requirement for the package may be the electrical breakdown (tracking) properties of the package. CTI (comparative tracking index) is used to measure the electrical breakdown (tracking) properties of insulating materials. One applicable standard for CTI may be IEC60664, which defines CTI>400 and CTI>600. Another electrical requirement may be creepage, which refers to the leakage path along the surface of an electrically insulating material interposed between two conductors. Still other electrical requirements may be electrical RTI≥140° C., and/or the ability of the module to tolerate an 85° C./85% RH test with applied blocking voltage (e.g. 100%, 80% or 60% of blocking voltage) of the semiconductors for 168 h, 500 h or even 1000 h without causing excessive leakage current between terminals, substrate tracks or semiconductor electrodes.

One predetermined mechanical requirement for the package may be thermal resistance at the interface between the molded plastic body 102 and another body such as a heatsink. Another predetermined mechanical requirement may be robustness to mechanical stress e.g. through compression, vibration and/or shock. Still other mechanical requirements may be elongation at yield ≥1%, preferred, and/or mechanical RTI≥140° C.

One predetermined chemical requirement for the package may be corrosion or other chemical action. Certain components of the power semiconductor package may be susceptible to corrosion or other chemical action, e.g. such as the package terminals 104 and semiconductor components 100 housed within the package. Materials sensitive to corrosion or other chemical action, electrochemical migration and dendritic growth include aluminum, copper and silver.

One predetermined environmental requirement for the package may be the degree to which smoke is vented and released from the package. Another predetermined environmental requirement for the package may be the likelihood of the package catching fire or combusting during a failure event or under extreme operating conditions. For example, the package may have to satisfy one or more environmental requirements specified in the following environmental standards: RoHS; RoHS directive defined in REACH; UL94V0; and/or EN45545, including HL2 and/or R22.

The above list of predetermined electrical, mechanical, chemical and environmental requirements is provided for merely illustrative purposes, and is not intended to be limiting. The semiconductor package may be required to satisfy fewer, additional or different electrical, mechanical, chemical and/or environmental requirements. In each case, the molded plastic body 102 which encases the semiconductor die 100 satisfies only a subset of the predetermined electrical, mechanical, chemical and/or environmental requirements which the package must satisfy.

To ensure that the semiconductor package satisfies all predetermined electrical, mechanical, chemical and/or environmental requirements assigned to the semiconductor package, the package further includes a coating 106 applied to at least part of the molded plastic body 102 and/or part of the package terminals 104. The coating 106 satisfies each predetermined electrical, mechanical, chemical and/or environmental requirement assigned to the semiconductor package not satisfied by the molded plastic body 102.

According to the embodiment illustrated in FIG. 1, the coating 106 is applied only to the molded plastic body 102.

According to the embodiment illustrated in FIG. 2, the coating 106 is applied only to the package terminals 104 in a region where the terminals 104 protrude from the molded plastic body 102.

According to the embodiment illustrated in FIG. 3, the coating 106 is applied only to the molded plastic body 102 in a region where the package terminals 106 protrude from the molded plastic body 102, including between adjacent ones of the terminals 104.

In each embodiment, the semiconductor die 100 is attached to a substrate (not shown) such as a die paddle of a leadframe, circuit board, ceramic laminate, etc. and the package terminals 104 are electrically connected to contact pads on the die 100 e.g. by wire bonds, metal clips, metal ribbons, or by direct attach in the case of a die paddle, etc.

The semiconductor die 100 and substrate are then embedded in the molded plastic body 102 via a molding process such as injection molding, transfer molding, film assisted molding (FAM), etc. The coating 106 is then applied in certain regions e.g. as shown in FIGS. 1-3, and provides a corrosion barrier between the package terminals 104 and the molded plastic body 102.

FIGS. 4 through 8 illustrate further embodiments of a semiconductor package which meets a plurality of predetermined electrical, mechanical, chemical and/or environmental requirements, and which includes one or more semiconductor dies 200 covered by a molded plastic body 202. According to these embodiments, the molded plastic body 202 forms a housing or lid that is attached to a substrate 204. Each semiconductor die 200 included in the package is attached to the substrate 204 which can be, e.g., a die paddle of a leadframe, circuit board, ceramic laminate, a ceramic substrate such as a DCB (direct copper bonded), AMB (active metal brazed) or DAB (direct aluminum bonded) substrate, substrates assembled on a base plate, etc. Terminals 206 of the package are attached to the substrate 204 and protrude through the molded plastic body 202. The package terminals 206 are electrically connected to contact pads on each semiconductor die 200 e.g. by wire bonds, metal clips, metal ribbons, flexible boards, chip embedding technology such as eWLB (embedded wafer level ball grid array), etc. Electrical connections between the package terminals 206 and each semiconductor die 200 included in the package are not shown for ease of illustration in FIGS. 4 through 8. Each semiconductor die 200 housed within the package may include one or more active devices, the type of which is unimportant as previously explained herein in connection with FIGS. 1 through 3.

Figure 4:
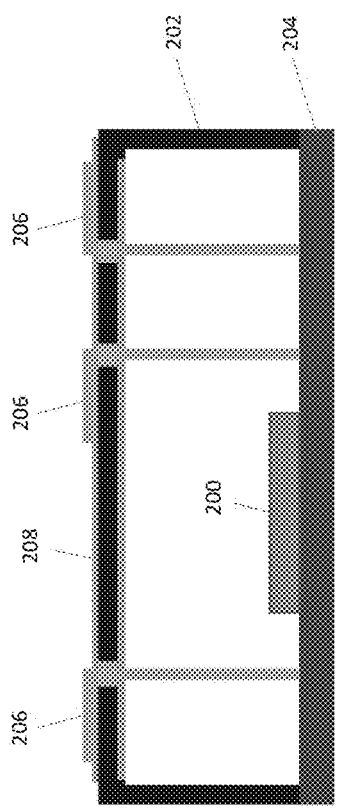
FIGS. 4 through 8 illustrate perspective views of different embodiments of a semiconductor package which meets a plurality of predetermined electrical, mechanical, chemical and/or environmental requirements, and which includes one or more semiconductor dies covered by a molded plastic body.

According to the embodiment illustrated in FIG. 4, a coating 208 is selectively applied to desired regions of the molded plastic body 202 to ensure that each predetermined electrical, mechanical, chemical and/or environmental requirement assigned to the semiconductor package and not satisfied by the molded plastic body 202 is satisfied by the coating 208. Selective coating can be realized by applying a mask to regions of the molded plastic body 202 not to be covered by the coating 208. The mask is removed e.g. using a solvent after the coating is applied. In another example, a blanket coating process is followed by a selective etching process which removes the coating 208 from regions of the molded plastic body 202.

Figure 5:
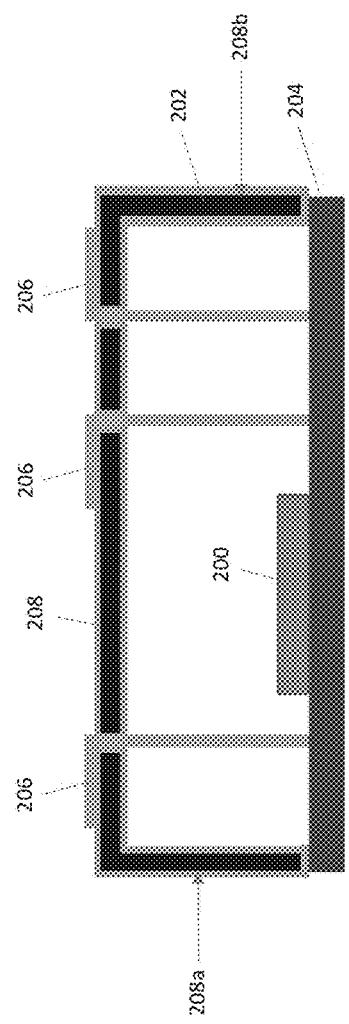

FIG. 5 illustrates an embodiment of a semiconductor package which is similar to the embodiment illustrated in FIG. 4. Different, however, the sidewalls 208a, 208b of the molded plastic body 202 are also covered by the coating 208.

Figure 6:
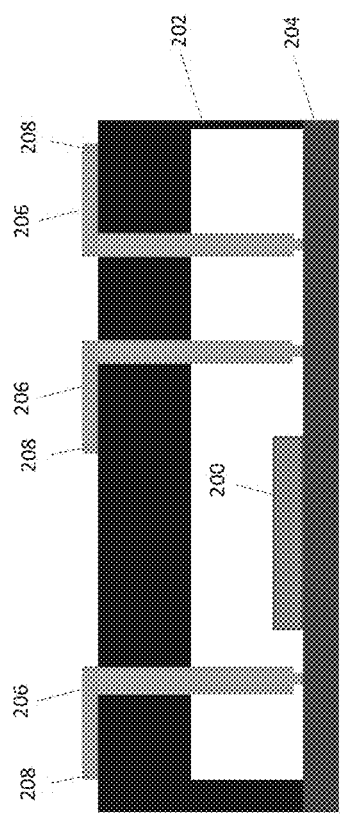

According to the embodiment illustrated in FIG. 6, the package terminals 206 are inserted into the molded plastic body 202 after the coating 208 is applied to the terminals 206. In the case of injection molding, the coating 208 is applied to the package terminals 206 and the coated terminals 206 are then injection molded into the plastic body 202. In the case of transfer molding, the coating 208 is applied to the package terminals 206, the coated terminals 206 are attached to the substrate 204, and afterwards the module is transfer molded. In either case, the coating 208 withstands the temperature of the molding process.

Figure 7:
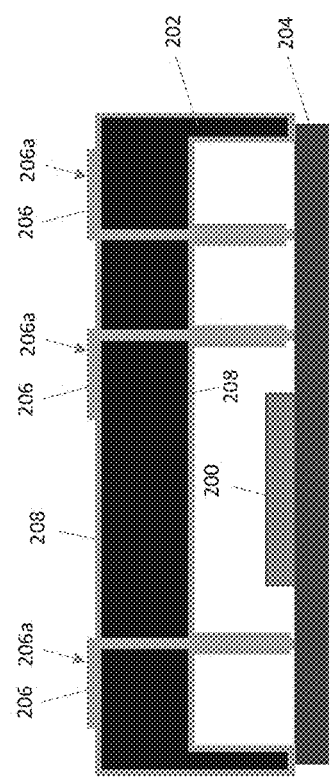

According to the embodiment illustrated in FIG. 7, the package terminals 206 are molded into the plastic body 202. The coating 208 is then applied to the entire package with the terminals 206. The coating 208 is removed from external contact surfaces 206a of the package terminals 206, to ensure proper connection to another body e.g. such as a circuit board. A mask can be applied to the external contact surfaces 206a of the package terminals 206, or the coating 208 can be removed by an etching process.

Figure 8:
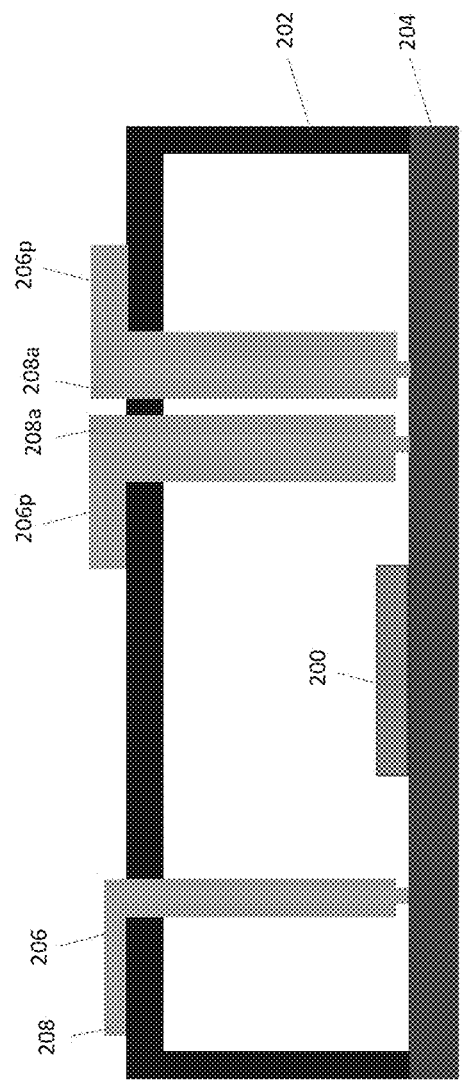

FIG. 8 illustrates an embodiment of a semiconductor package which is similar to the embodiment illustrated in FIG. 6. Different, however, a thicker coating 208a is applied to adjacent package terminals 206p which are at different electric potentials (e.g. source and drain potentials, collector and emitter potentials, or anode and cathode potentials) as compared to other ones of the package terminals (e.g. gate or signal terminals). This way, the thicker coating 208a applied to the power terminals 206p of the package can isolate the full voltage. In one embodiment, the thicker coating 208a applied to adjacent ones of the package terminals 208a at different potentials has a thickness in a range between 50 micrometers ($\mu$m) and 1 millimeter (mm) to isolate the adjacent terminals 206p at different potentials.

Additional semiconductor package embodiments are described next, which apply to both the embodiments illustrated in FIGS. 1-3 (semiconductor die embedded in molded plastic body encapsulant) and the embodiments illustrated in FIGS. 4-8 (semiconductor die covered by molded plastic body housing). In each case, the coating 106/208 can be poly-para-xylylene, a thermoplastic or thermoset polymer, silicone or thixotropic silicone, an epoxy, polyester, glass, etc.

In one embodiment, the molded plastic body 102/202 of the semiconductor package comprises a flame-retardant material and fulfils predetermined mechanical, fire, smoke and CTI>600V requirements. Corrosion or other chemical action on the package terminals 104/206 which are in physical contact with the molded plastic body 102/202 is prevented or at least minimized by a coating 106/208 applied to at least part of the molded plastic body 102/202 and/or part of the package terminals 104/206 by a CVD (chemical vapor deposition) process. In the CVD process, para-cyclophane is used to deposit a poly-para-xylylene layer having a thickness of at least 1 $\mu$m, preferably between 1 $\mu$m and 25 $\mu$m. The molded plastic body 102/202 may be coated completely or only in areas where the package terminals 104/206 contact the body 102/202, and also between the terminals 104/206, e.g. along creepage paths. The CVD coating process can be selective in that the package terminals 104/206 can be coated outside contact areas of the terminals 104/206 which make contact to other electrical conductors of the system. As previously described herein, a mask can be applied to the regions of the molded plastic body 102/202 and/or package terminals 104/206 not to be covered by the coating 106/208. The mask is removed e.g. using a solvent after the coating 106/208 is applied. In another example, a blanket coating process is followed by a selective etching process which removes the coating 106/208 from regions of the molded plastic body 102/202 and/or package terminals 104/206.

In another embodiment, the molded plastic body 102/202 of the semiconductor package comprises a flame-retardant material and fulfils predetermined mechanical, fire, smoke and CTI>600V requirements. Corrosion or other chemical action on the package terminals 104/206 which are in physical contact with the molded plastic body 102/202 is prevented or at least minimized by a coating 106/208 applied to at least part of the molded plastic body 102/202 and/or part of the package terminals 106/208 by an electrostatic powder coating process. Clean thermoplastic or thermoset polymers are deposited during the electrostatic powder coating process. The resulting coating 106/208 can have a thickness of least 50 μm, e.g. >100 μm. The electrostatic powder coating process can be selected as described above, so that the package terminals 104/206 are coated outside contact areas which make contact to other electrical conductors of the system.

In yet another embodiment, the molded plastic body 102/202 of the semiconductor package comprises a flame-retardant material and fulfils predetermined mechanical, fire, smoke and CTI>600V requirements. Leakage current through the molded plastic body 102/202 and between the package terminals 104/206 is prevented by a selective coating, accomplished by an electrostatic powder coating process. In this embodiment, the coating 106/208 is a thermoplastic or thermoset polymer having a deposited thickness in a range between 50 micrometers and 1 millimeter. Such a thick coating ensures dielectric strength and takes over a significant part, if not all, of the voltage to be isolated between the package terminals 104/206.

In still another embodiment, the molded plastic body 102/202 of the semiconductor package comprises a flame-retardant material and fulfils predetermined mechanical, fire and smoke requirements but not the CTI requirement for the package. Corrosion or other chemical action on the package terminals 104/206 which are in physical contact with the molded plastic body 102/202 is prevented or at least minimized by a coating 106/208 that comprises a plastic material which does not require additives for flame retardance and fire and smoke requirements, such as PPS (polyphenylene sulfide), LCP (liquid-crystal polymer), silicone, thixotropic silicone, etc. The plastic-based coating 106/208 achieves a high CTI-value e.g. >600V. The coating 106/208 can be deposited on selective areas of the molded plastic body 102/202 and/or the package terminals 104/206 where high CTI is required, e.g. by an electrostatic powder coating process.

In another embodiment, the coating 106/208 is applied by whirl sintering which allows for thicker layers such as 0.5 mm, 1 mm or even thicker coatings applied to the molded plastic body 102/202 and/or the package terminals 104/206. For example, coatings based on epoxy, polyester or thermoplastics can be used in both electrostatic powder coating or whirl sintering processes. In any of these processes, coating by glass also is an option.

Any of the coatings described above preferably have a low content of aggressive ions, which are known to cause corrosion or change characteristics of semiconductors, directly or indirectly. Some examples of such ions are chlorine, sodium, potassium, fluorine, phosphorous or any other ions and ionic molecules which can be extracted by water or water vapor from the coating material. The maximum content of ions and/or ionic molecules which can be extracted from the coating 106/208 by water or water vapor preferably have a maximum content below 1000 ppm or 100 ppm by weight, according to an embodiment. The extractable ionic content of the coating material can be detected as follows. The coating material in its final form is reduced to power form for investigation (e.g. particle size <100 μm). The powder is mixed with deionized water in a clean environment (e.g. clean room 10000 or better). The sample is stored at a temperature of about 90° C. for about 30 minutes. The sample is then filtered. Ion chromatography of water with dissolved ions indicates the content of aggressive ions.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package which meets a plurality of predetermined electrical, mechanical, chemical and/or environmental requirements, the semiconductor package comprising:
   a semiconductor die embedded in or covered by a molded plastic body, the molded plastic body satisfying only a subset of the plurality of predetermined electrical, mechanical, chemical and/or environmental requirements;
   a plurality of terminals protruding from the molded plastic body and electrically connected to the semiconductor die; and
   a coating applied to at least part of the molded plastic body and/or part of the plurality of terminals, the coating satisfying each predetermined electrical, mechanical, chemical and/or environmental requirement not satisfied by the molded plastic body,
   wherein the coating has a low ion content in that ions and/or ionic molecules which can be extracted from the coating by water or water vapor have a maximum content below 1000 ppm by weight.

2. The semiconductor package of claim 1, wherein the coating is applied only to the plurality of terminals in a region where the plurality of terminals protrudes from the molded plastic body so as to provide a corrosion barrier between the plurality of terminals and the molded plastic body.

3. The semiconductor package of claim 2, wherein the coating applied to adjacent ones of the terminals at different potentials has a thickness in a range between 50 micrometers and 1 millimeter to isolate the adjacent terminals at different potentials.

4. The semiconductor package of claim 1, wherein the coating is applied only to the molded plastic body at least in a region where the plurality of terminals protrudes from the molded plastic body, including between adjacent ones of the terminals, so as to provide a corrosion barrier between the plurality of terminals and the molded plastic body.

5. The semiconductor package of claim 1, wherein the coating comprises poly-para-xylylene applied to at least part of the molded plastic body and/or part of the plurality of terminals.

6. The semiconductor package of claim 5, wherein the poly-para-xylylene has a thickness in a range between 1 micrometer and 25 micrometers.

7. The semiconductor package of claim 1, wherein the coating comprises a thermoplastic or thermoset polymer applied to at least part of the molded plastic body and/or part of the plurality of terminals.

8. The semiconductor package of claim 7, wherein the thermoplastic or thermoset polymer has a thickness in a range between 50 micrometers and 1 millimeter.

9. The semiconductor package of claim 1, wherein the coating comprises silicone or thixotropic silicone applied to at least part of the molded plastic body and/or part of the plurality of terminals.

10. The semiconductor package of claim 1, wherein the coating comprises an epoxy, polyester or thermoplastic applied to at least part of the molded plastic body and/or part of the plurality of terminals.

11. The semiconductor package of claim 1, wherein the coating comprises glass applied to at least part of the molded plastic body and/or part of the plurality of terminals.

12. The semiconductor package of claim 1, wherein the maximum content of the ions and/or ionic molecules is below 100 ppm by weight.

13. A method of manufacturing a semiconductor package which meets a plurality of predetermined electrical, mechanical, chemical and/or environmental requirements, the method comprising:
applying a coating to at least part of a molded plastic body and/or part of a plurality of terminals; and
embedding or covering a semiconductor die by the molded plastic body,
wherein the terminals protrude from the molded plastic body and are electrically connected to the semiconductor die,
wherein the molded plastic body satisfies only a subset of the plurality of predetermined electrical, mechanical, chemical and/or environmental requirements,
wherein the coating satisfies each predetermined electrical, mechanical, chemical and/or environmental requirement not satisfied by the molded plastic body,
wherein the coating has a low ion content in that ions and/or ionic molecules which can be extracted from the coating by water or water vapor have a maximum content below 1000 ppm by weight.

14. The method of claim 13, wherein applying the coating to at least part of the molded plastic body and/or part of the plurality of terminals comprises:
depositing para-cyclophane via a chemical vapor deposition process on at least part of the molded plastic body and/or part of the plurality of terminals.

15. The method of claim 13, wherein applying the coating to at least part of the molded plastic body and/or part of the plurality of terminals comprises:
depositing an epoxy, polyester, a thermoplastic polymer or a thermoset polymer via an electrostatic powder coating process on at least part of the molded plastic body and/or part of the plurality of terminals.

16. The method of claim 13, wherein applying the coating to at least part of the molded plastic body and/or part of the plurality of terminals comprises:
depositing an epoxy, polyester, a thermoplastic polymer or a thermoset polymer via a whirl sintering process on at least part of the molded plastic body and/or part of the plurality of terminals.

17. The method of claim 13, wherein applying the coating to at least part of the molded plastic body and/or part of the plurality of terminals comprises:
applying the coating to the plurality of terminals prior to forming the molded plastic body with the plurality of terminals; and
removing the coating from a contact region of the plurality of terminals which is outside the molded plastic body.

18. The method of claim 13, wherein applying the coating to at least part of the molded plastic body and/or part of the plurality of terminals comprises:
applying the coating to at least part of the molded plastic body and/or part of the plurality of terminals after forming the molded plastic body with the plurality of terminals.

19. The method of claim 13, wherein applying the coating to at least part of the molded plastic body and/or part of the plurality of terminals comprises:
applying the coating with a greater thickness on adjacent terminals at different potentials than on other ones of the terminals.

20. A semiconductor package which meets a plurality of predetermined electrical, mechanical, chemical and/or environmental requirements, the semiconductor package comprising:
a semiconductor die embedded in or covered by a molded plastic body, the molded plastic body satisfying only a subset of the plurality of predetermined electrical, mechanical, chemical and/or environmental requirements;
a plurality of terminals protruding from the molded plastic body and electrically connected to the semiconductor die; and
a coating applied to at least part of the molded plastic body and/or part of the plurality of terminals, the coating satisfying each predetermined electrical, mechanical, chemical and/or environmental requirement not satisfied by the molded plastic body,
wherein the coating is applied only to the molded plastic body at least in a region where the plurality of terminals protrudes from the molded plastic body, including between adjacent ones of the terminals, so as to provide a corrosion harrier between the plurality of terminals and the molded plastic body.

21. A method of manufacturing a semiconductor package which meets a plurality of predetermined electrical, mechanical, chemical and/or environmental requirements, the method comprising:
applying a coating to at least part of a molded plastic body and/or part of a plurality of terminals; and
embedding or covering a semiconductor die by the molded plastic body,
wherein the terminals protrude from the molded plastic body and are electrically connected to the semiconductor die,
wherein the molded plastic body satisfies only a subset of the plurality of predetermined electrical, mechanical, chemical and/or environmental requirements,
wherein the coating satisfies each predetermined electrical, mechanical, chemical and/or environmental requirement not satisfied by the molded plastic body,
wherein applying the coating to at least part of the molded plastic body and/or part of the plurality of terminals comprises depositing an epoxy, polyester, a thermoplastic polymer or a thermoset polymer via an electrostatic powder coating process or a whirl sintering process on at least part of the molded plastic body and/or part of the plurality of terminals.

22. A method of manufacturing a semiconductor package which meets a plurality of predetermined electrical, mechanical, chemical and/or environmental requirements, the method comprising:
applying a coating to at least part of a molded plastic body and/or part of a plurality of terminals; and embedding or covering a semiconductor die by the molded plastic body, wherein the terminals protrude from the molded plastic body and are electrically connected to the semiconductor die, wherein the molded plastic body satisfies only a subset of the plurality of predetermined electrical, mechanical, chemical and/or environmental requirements, wherein the coating satisfies each predetermined electrical, mechanical, chemical and/or environmental requirement not satisfied by the molded plastic body, wherein applying the coating to at least part of the molded plastic body and/or part of the plurality of terminals comprises applying the coating with a greater thickness on adjacent terminals at different potentials than on other ones of the terminals.

* * * * *

UNITED STATES PATENT AND TRADEMARK OFFICE
CERTIFICATE OF CORRECTION

PATENT NO. : 10,177,057 B2
APPLICATION NO. : 15/380656
DATED : January 8, 2019
INVENTOR(S) : R. Bayerer Page 1 of 1

It is certified that error appears in the above-identified patent and that said Letters Patent is hereby corrected as shown below:

In the Claims

Column 10, Line 36 (Claim 20, Line 22), please change "harrier" to -- barrier --.

Signed and Sealed this
Ninth Day of April, 2019

Andrei Iancu
*Director of the United States Patent and Trademark Office*